US 6,828,834 B2

(12) United States Patent
Sivero et al.

(10) Patent No.: US 6,828,834 B2
(45) Date of Patent: Dec. 7, 2004

(54) POWER-ON MANAGEMENT FOR VOLTAGE DOWN-CONVERTER

(75) Inventors: Stefano Sivero, Vergiate (IT); Riccardo Riva-Reggiori, Segrate (IT); Lorenzo Bedarida, Vinercate (IT)

(73) Assignee: Atmel Corporation, San Jose, CA (US)

( * ) Notice: Subject to any disclaimer, the term of this patent is extended or adjusted under 35 U.S.C. 154(b) by 191 days.

(21) Appl. No.: 10/328,603

(22) Filed: Dec. 24, 2002

(65) Prior Publication Data

US 2004/0046538 A1 Mar. 11, 2004

(30) Foreign Application Priority Data

Sep. 6, 2002 (IT) ..................................... MI2002A1901

(51) Int. Cl.[7] .............................................. H03L 7/00
(52) U.S. Cl. ........................ 327/143; 327/198; 365/226
(58) Field of Search ............................. 365/226, 227, 365/229, 189.09; 327/143, 198, 544, 564, 539, 540; 713/300, 320, 322

(56) References Cited

U.S. PATENT DOCUMENTS

| 5,319,601 A | * | 6/1994 | Kawata et al. ............... 365/226 |
| 5,424,986 A | | 6/1995 | McClure ...................... 365/200 |
| 5,430,882 A | | 7/1995 | Tilghman et al. ........... 395/750 |
| 5,878,049 A | | 3/1999 | Pascucci .................... 371/21.1 |
| 5,881,014 A | | 3/1999 | Ooishi ......................... 365/226 |
| 6,064,188 A | | 5/2000 | Takashima et al. .......... 323/316 |
| 6,118,315 A | | 9/2000 | Guedj .......................... 327/143 |
| 6,259,286 B1 | | 7/2001 | Papaliolios ................. 327/143 |
| 6,297,624 B1 | | 10/2001 | Mitsui et al. ............... 323/316 |
| 6,492,850 B2 | * | 12/2002 | Kato et al. ................... 327/143 |

OTHER PUBLICATIONS

K. Ishibashi et al., "A Voltage Down Converter with Sub-micron-ampere Standby Current for Low-Power Static RAM's", *IEEE Journal of Solid-State Circuits*, vol. 27, No. 6, Jun. 1992, pp. 920-926.

G.W. den Besten et al., "Embedded 5 V-to-3.3 V Voltage Regulator for Supplying Digital IC's in 3.3 V CMOS Technology", *IEEE Journal of Solid-State Circuits*, vol. 33, No. 7, Jul. 1998, pp. 956-962.

* cited by examiner

*Primary Examiner*—Shawn Riley
(74) *Attorney, Agent, or Firm*—Thomas Schneck; Mark Protsik

(57) ABSTRACT

A power-on management system for an on-chip voltage down-converter, monitoring both external and internal voltage supplies to independently determine when both supplies have reached minimum levels for proper operation of on-chip circuitry. The power-on management system supplies output signals that: control the discharge of the internal supply nodes at the initiation of power-on; force the active mode of the voltage down-converter; and deactivate a fast local voltage reference on completion of power-on.

15 Claims, 6 Drawing Sheets

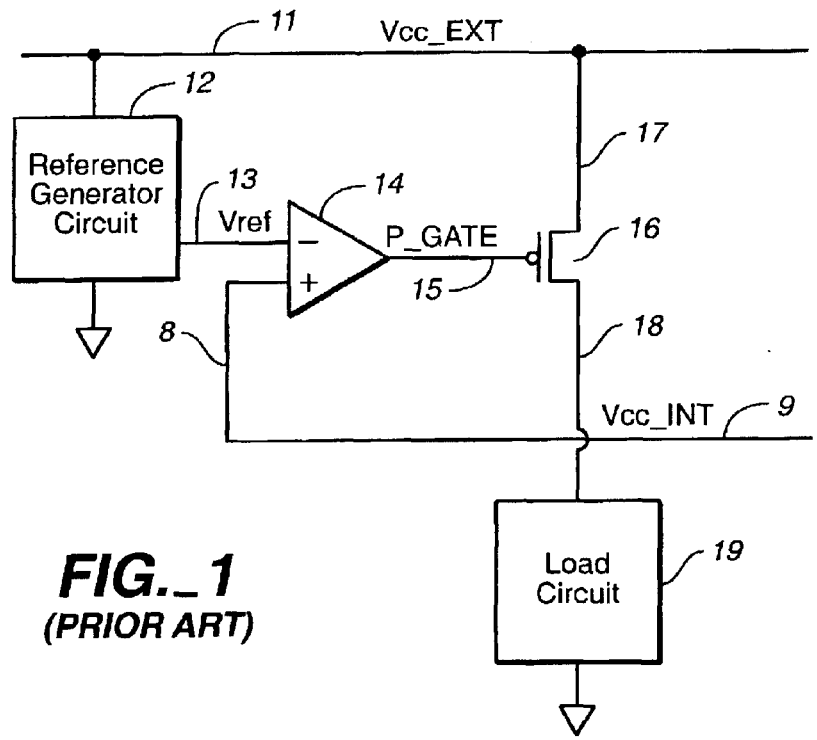
FIG._1
*(PRIOR ART)*
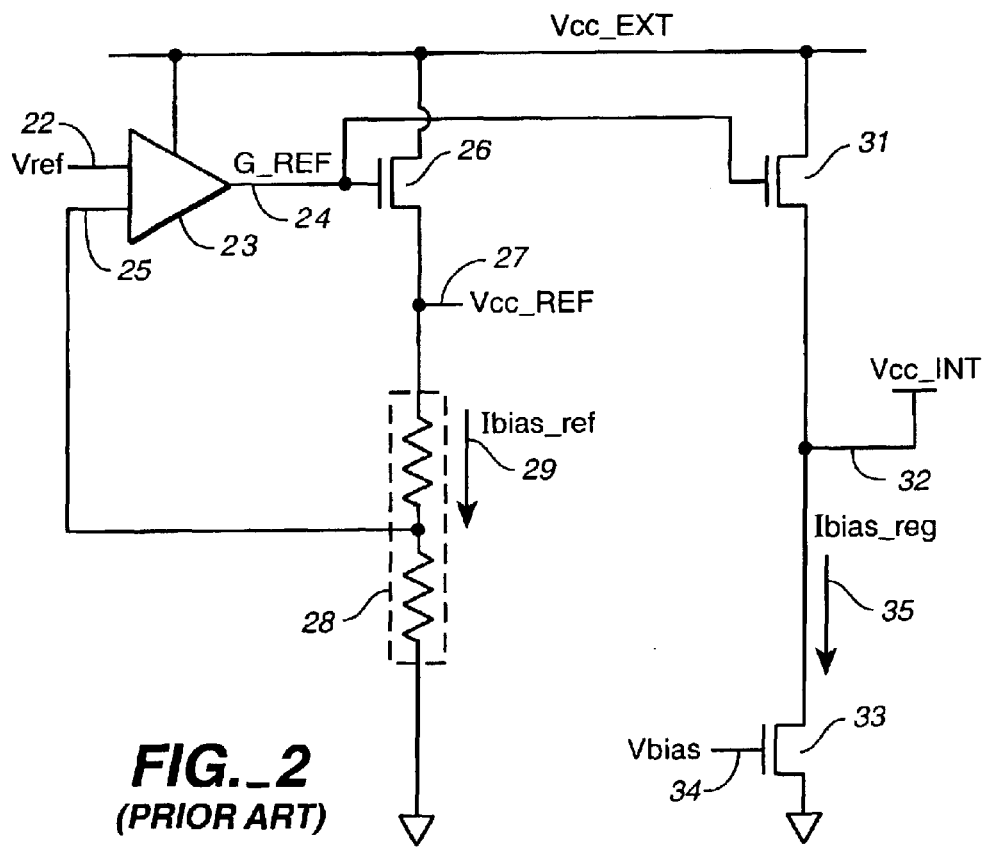
FIG._2
*(PRIOR ART)*

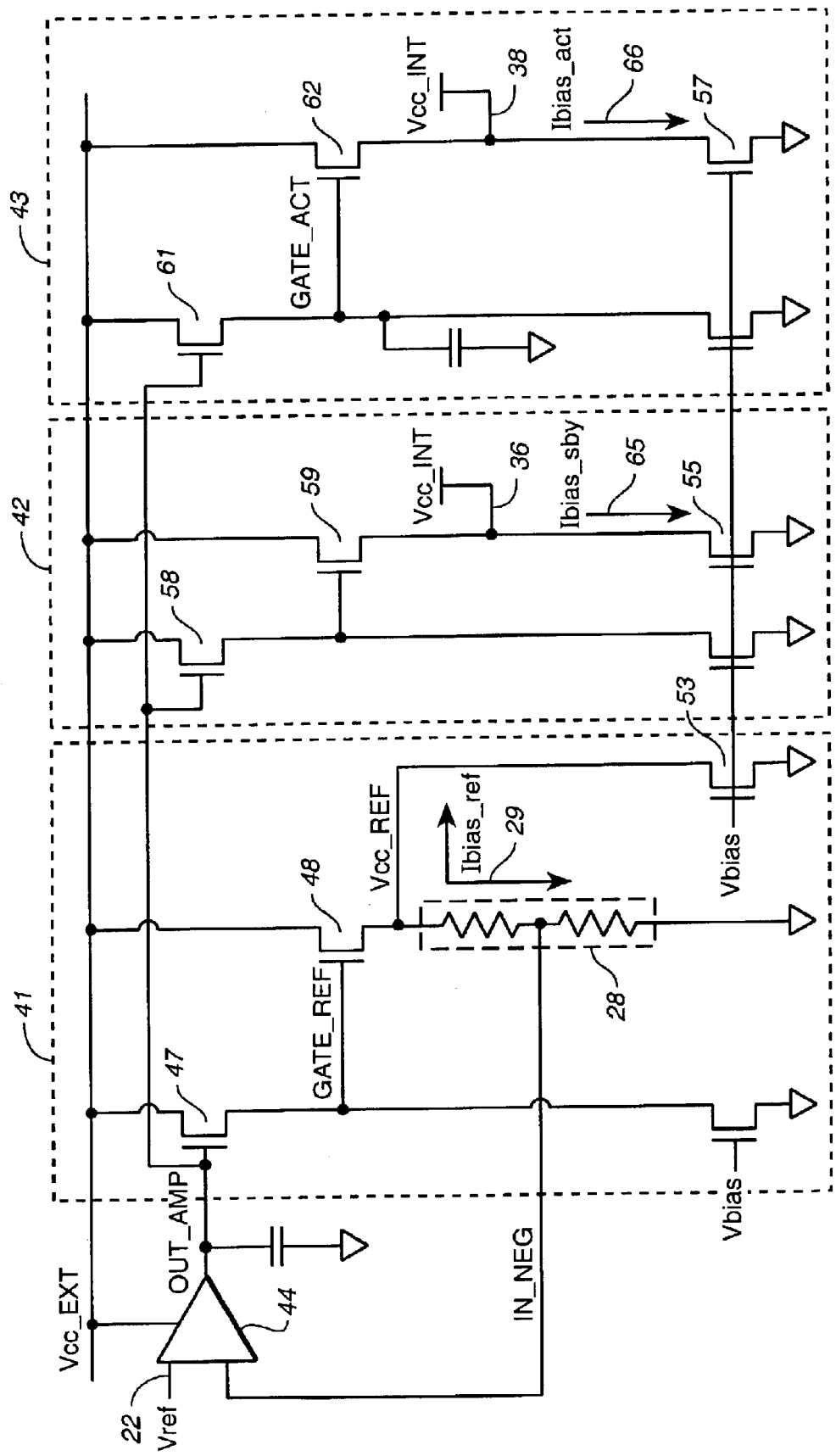
FIG._3
*(PRIOR ART)*

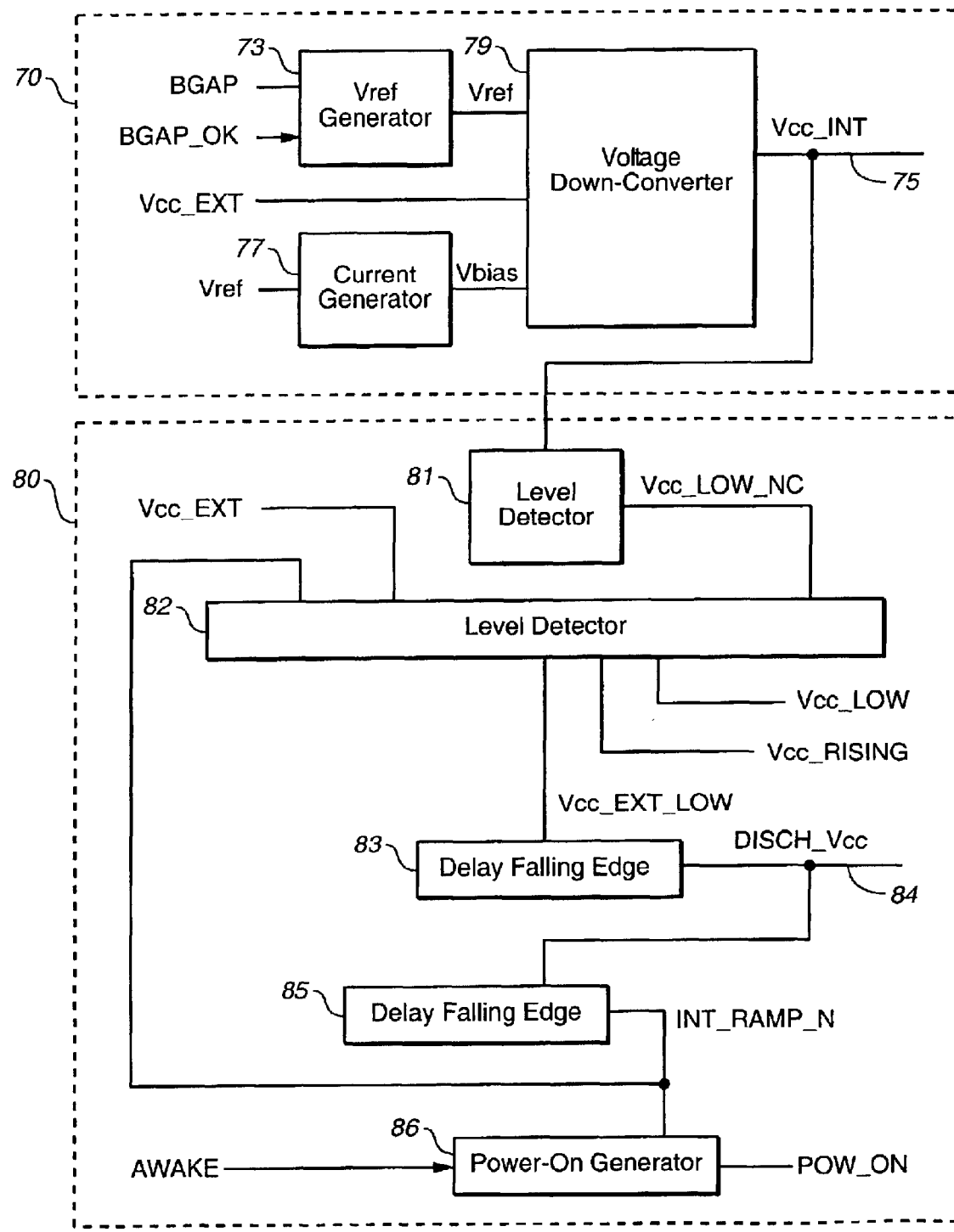
FIG._4

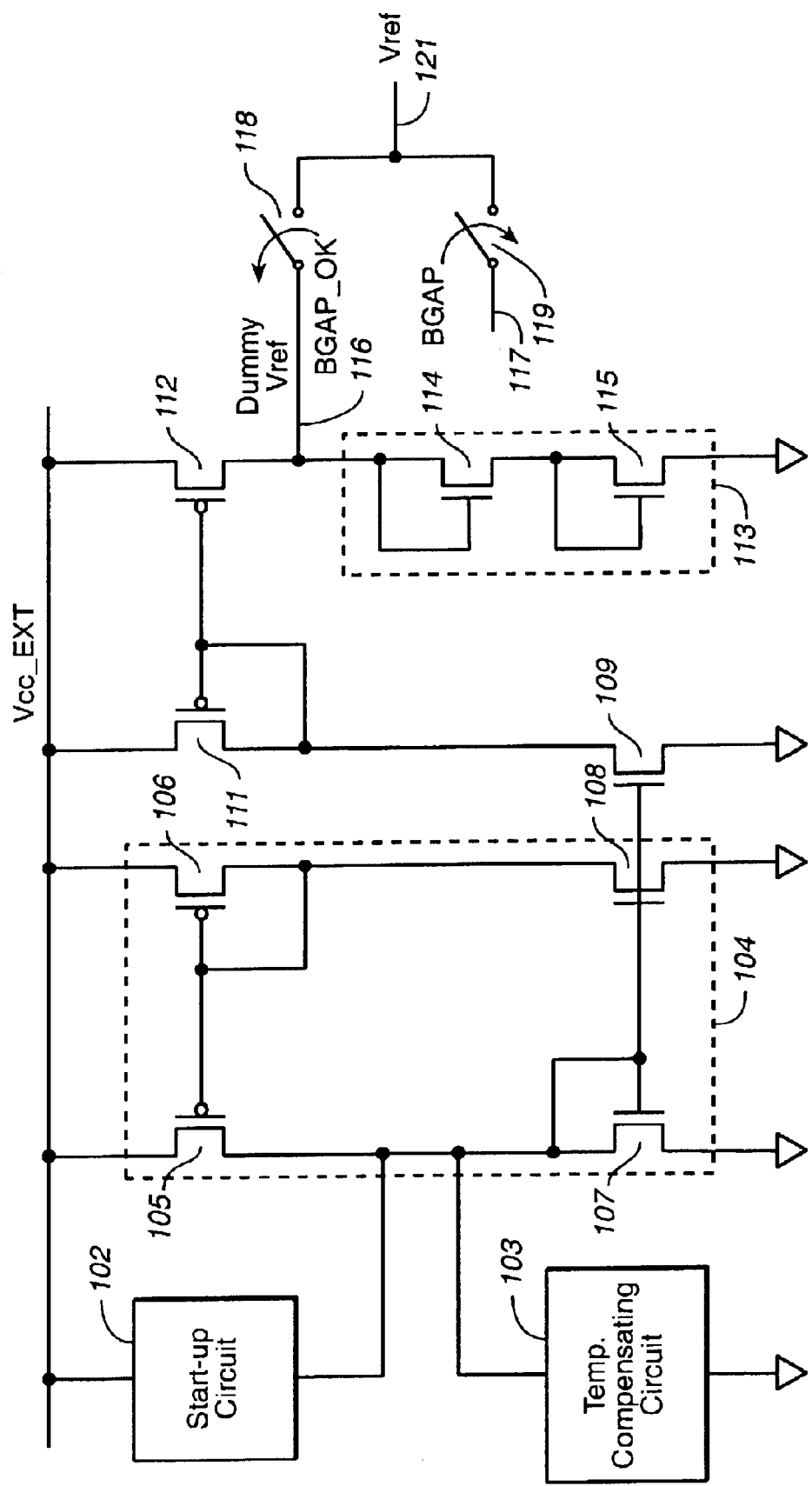
FIG._5

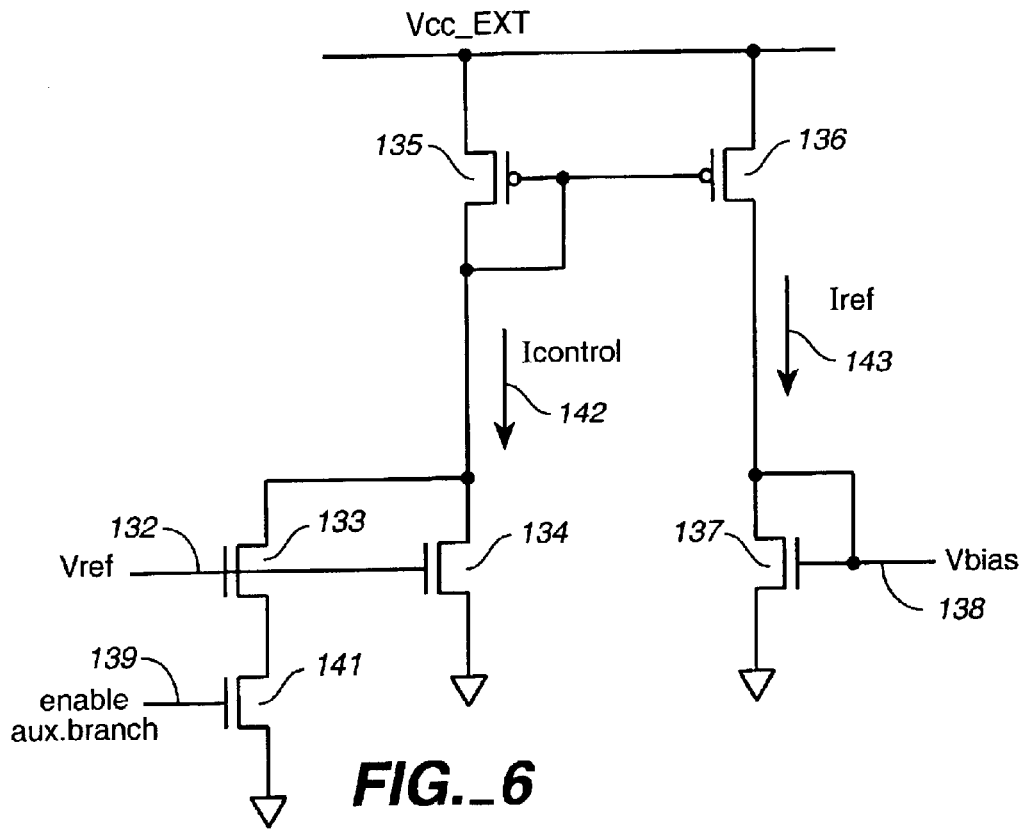
FIG._6
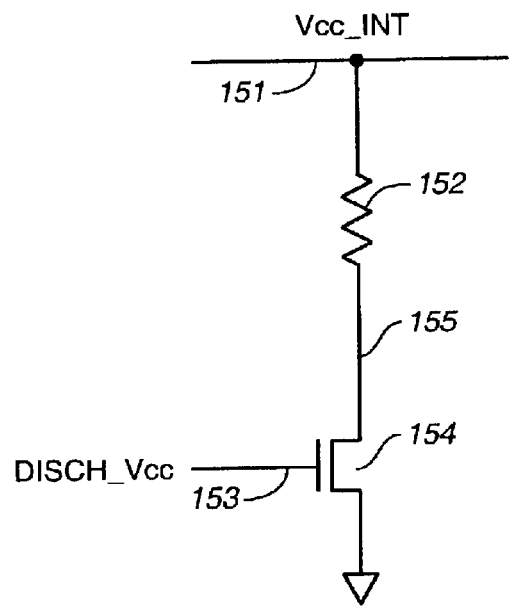
FIG._7

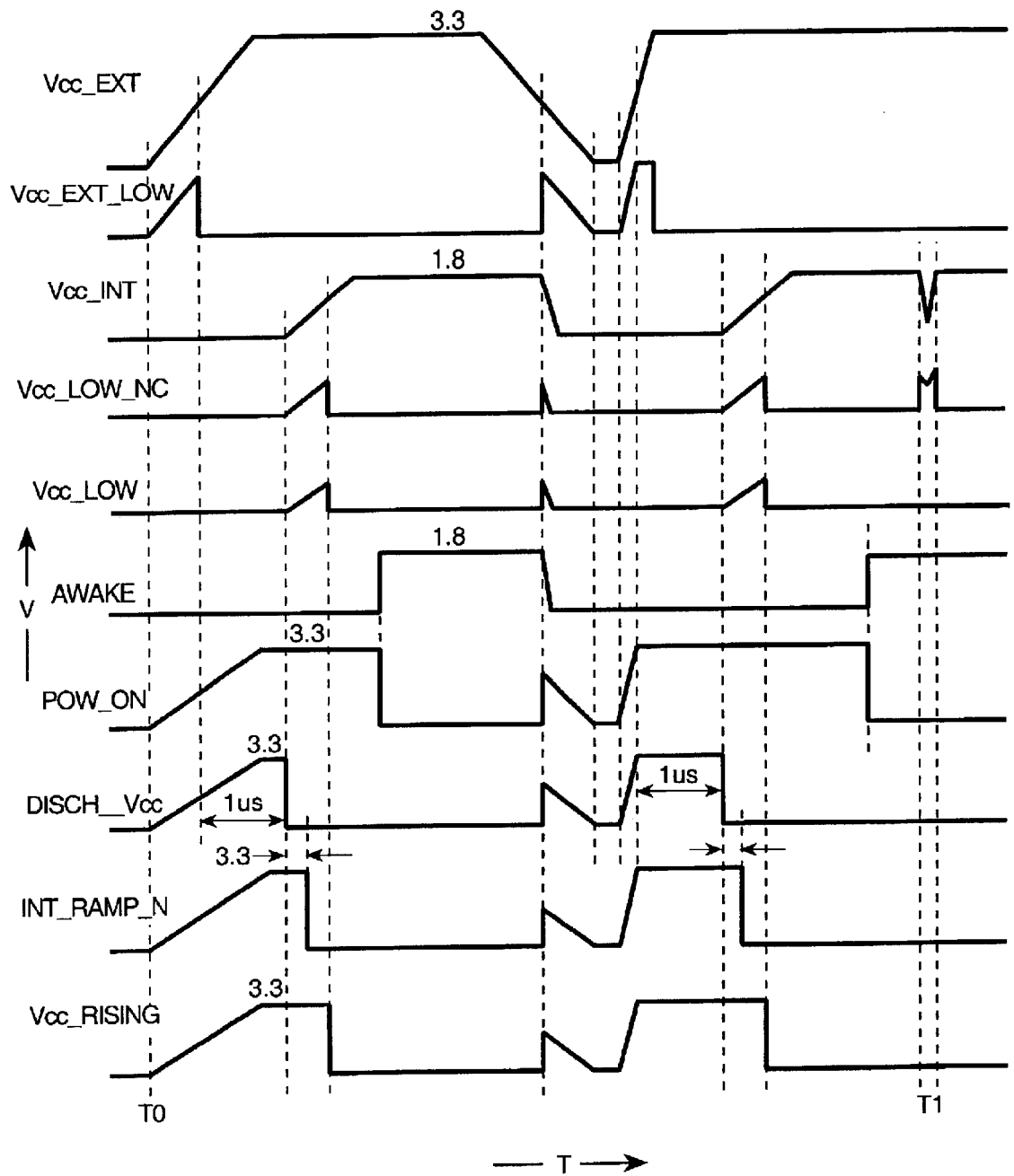
FIG._8

POWER-ON MANAGEMENT FOR VOLTAGE DOWN-CONVERTER

TECHNICAL FIELD

This invention relates to the field of power supplies for integrated circuits, and in particular to power-on management for on-chip voltage down-converters.

BACKGROUND ART

On-chip voltage down-converters are widely used in integrated circuits, such as memory devices.

FIG. 1 shows a prior art voltage down-converter in which a differential amplifier 14 drives the gate 15 of a p-channel MOS transistor 16 with its source 17 connected to the external power supply 11, Vcc_EXT, and its drain 18 connected to the internal power supply, Vcc_INT, node 9. The first amplifier input 13 is at internal reference voltage, Vref, by connection to reference generator circuit 12; the control loop is closed by connecting the second amplifier input 8 to the Vcc_INT node 9. As the current consumption of the load circuit 19 increases, Vcc_INT will decrease; eventually Vcc_INT falls below Vref and the amplifier responds by lowering P_GATE, which increases the conductivity of the p-channel of transistor 16, resulting in an increased current flow to the Vcc_INT node 9. For applications such as flash memory, in which the current consumption has fast transients and high peak currents, the circuit of FIG. 1 has an inadequate high frequency response, to the extent that large drops in Vcc_INT occur at the onset of a fast current transient; the inadequate high frequency response is to a large extent due to the RC constant of the Vcc_INT node 9. An improved circuit, to overcome this deficiency, is shown in FIG. 2.

The prior art voltage down-converter in FIG. 2 is basically comprised of: a power device, transistor 31, providing current at the Vcc_INT node 32; a replica device with scaled W/L, transistor. 26; and a differential amplifier 23 with a feedback loop closed on the replica device, for regulating G_REF so as to keep Vcc_REF within a desired voltage range. The power device of the circuit is a source follower n-channel MOS transistor 31 with a very low threshold voltage. This transistor 31 has a very large W/L, ensuring its operation in the weak inversion region; this allows a small Vgs variation, even with the wide range of current required by the load circuit (a few $\mu$A to hundreds of mA). Coupled to the power device is a replica transistor 26 with a smaller W/L. The transistor gates are driven by G_REF, by connection to the amplifier output 24. The first amplifier input 22 is at Vref. The control loop is closed on the replica device by connection of the second amplifier input 25 to the voltage divider 28. Thus, the amplifier 23 with its feedback loop operates to keep the Vcc_REF node 27 within an allowed voltage range. Leaving the power device 31 and Vcc_INT node 32 out of the feedback loop improves the stability, bandwidth and gain control of the amplifier 23, particularly considering that the RC constant of the Vcc_INT node 32 is not well controlled. Sufficient bias currents must flow in the reference circuit, Ibias_ref 29, and regulated power circuit, Ibias_reg 35, in order to keep Vcc_REF and Vcc_INT within their allowed operating ranges; transistor 33, controlled by Vbias at its gate 34 can be used to increase Ibias_reg 35, when required. Satisfactory matching of the power device and the replica device is an issue for this circuit design. An improved circuit, to overcome this deficiency, is shown in FIG. 3.

The voltage down-converter has two modes of operation for memory devices: a stand-by mode in which the power consumption from the external supply must be very low, while providing Vcc_INT with current consumption from the device of up to 10 $\mu$A; and an active mode in which the voltage down-converter must provide Vcc_INT with current consumption from the device of up to 200 mA, while keeping Vcc_INT within an allowed voltage range of 1.6V to 2V.

The prior art voltage down-converter in FIG. 3 is comprised of three sections: the replica circuit 41 that is always on and generates the control signal OUT_AMP; the stand-by section 42; and the active section 43. Each section has two n-channel transistors (47 & 48, 58 & 59, and 61 & 62) compared with the single transistor of the design shown in FIG. 2. This configuration has the following advantages: reduced total output capacitance of the op-amp 44; better control of the transition from stand-by mode to active mode; and good de-coupling between the Vcc_INT nodes 36, 38 and the control loop. The reference current Ibias_ref 29 must be very low to minimize current consumption during the stand-by mode. When the active mode is entered the reference current branch is doubled (as shown for Ibias_ref 29), thus allowing the voltage down-converter to be biased quickly; this is achieved by controlling transistor 53 with signal Vbias. Vbias is also used to control the current in transistors 55 and 57, allowing faster biasing of the active and standby sections (bias currents: Ibias_act 66 and Ibias_sby 65). Since the voltage drop at the internal supply nodes 36 and 38 for a given device load current, Iload, depends on log(Iload/Ibias), a minimum Ibias must be ensured for Vcc_INT to remain within an acceptable range.

Consideration is now given specifically to the power-on phase for the voltage down-converter. It is desired to monitor both external and internal supplies, to be able to ensure that an internal power-on starts only when an external power-on occurs. It is also desired to force the active mode of the voltage down-converter at power-on. Further, it is desired to discharge the internal supply nodes of the voltage down-converter at the start of power-on, so as to ensure that the power-on always starts from the same initial condition. Furthermore, it is desired to provide a reference voltage for operation of the voltage down-converter, at the earliest opportunity during power-on.

It is an object of the present invention to provide an on-chip power-on management system to control these various power-on functions of a voltage down-converter.

SUMMARY OF THE INVENTION

The above object has been achieved by a power-on management system for an on-chip voltage down-converter, monitoring both external and internal voltage supplies to independently determine when both supplies have reached minimum levels for proper operation of on-chip circuitry. The power-on management system supplies output signals that: control the discharge of the internal supply nodes at the initiation of power-on; force the active mode of the voltage down-converter; and deactivate a fast local voltage reference on completion of power-on. The system comprises signal level detectors and devices for delaying the falling edge of input signals.

BRIEF DESCRIPTION OF THE DRAWINGS

FIG. 1 is a high level circuit diagram of a prior art voltage down-converter.

FIG. 2 is a basic circuit diagram of a prior art voltage down-converter.

FIG. 3 is a detailed circuit diagram of a prior art voltage down-converter.

FIG. 4 is a block diagram showing a voltage down-converter and power-on management system of the present invention.

FIG. 5 is a basic circuit diagram of a reference voltage generator in accord with the present invention.

FIG. 6 is a basic circuit diagram of a current generator in accord with the present invention.

FIG. 7 is a basic circuit diagram of an internal Vcc node discharger of the present invention.

FIG. 8 is a signal form diagram representing an operation of the power-on management system of the present invention.

BEST MODE OF CARRYING OUT THE INVENTION

FIG. 4 shows a block diagram of the internal voltage down-converter system 70 and power-on management system 80 of the present invention, including input and output signals. The voltage down converter 79 generates a regulated internal supply, Vcc_INT, from the external supply Vcc_EXT; the output of the voltage down-converter 79 is connected to the Vcc_INT node 75. The voltage down-converter 79 requires a reference voltage, Vref, which is provided by the Vref generator 73. The voltage down converter 79 also requires a bias current reference voltage, Vbias, which is provided by the current generator 77. An example of a voltage down-converter in accord with the present invention is shown in FIG. 3. The current generator 77 requires an input of a reference voltage, Vref. The Vref generator 73 can produce its own local voltage reference, or can use a temperature independent bandgap voltage reference, BGAP, provided as an input. The logic signal BGAP_OK, provided as an input to the Vref generator 73, indicates when the signal BGAP is at its correct value, of approximately 1.23V.

The power-on management system 80, Vref generator 73, and some components (an auxiliary current branch) of current generator 77 are all dedicated to the power-on phase of operation of the voltage down-converter 79; together they can be considered as a power-on system for the voltage down-converter.

FIG. 5 shows an example of a fast reference voltage generator suitable for use as local Vref generator 73 in FIG. 4. Start-up circuit 102 and temperature compensating circuit 103 are connected to an autobiasing current generator 104, which comprises p-channel transistors 105 and 106 and n-channel transistors 107 and 108. The autobiasing current generator 104 controls the current in transistor 109, which is mirrored, by the mirror circuit comprising p-channel transistors 111 and 112, into the diode chain 113, comprising diodes 114 and 115. A 'Dummy Vref', or local voltage reference, is generated at node 116; a temperature independent bandgap voltage reference, BGAP, is connected to node 117. Switches 118 and 119 are controlled by logic signal BGAP_OK; signal BGAP_OK is high when BGAP is at its correct value, otherwise it is low. The switches 118 and 119 operate so that Vref at node 121 will be provided by Dummy Vref until BGAP has attained its correct voltage, the signal BGAP_OK goes high and changes the positions of switches 118 and 119 so that Vref at node 121 is provided by BGAP. Further circuits (not shown) may be incorporated into the reference voltage generator of FIG. 5, such as disabling and other optional circuits. An example of such a circuit is a switch that switches the power supply, Vcc_EXT, for the local Vref generator 73 to ground, thus disabling the local Vref generator, when power-on is complete; this switch being activated by a signal POW_ON generated by the power-on management system 80

FIG. 6 shows an example of a current generator suitable for use as current generator 77 in FIG. 4. A control current 142, Icontrol, is generated by n-channel transistors 133 and 134, controlled by a constant voltage signal, Vref, applied to their gates 132. This current is mirrored, by the mirror circuit comprising p-channel transistors 135 and 136, providing a reference current 143, Iref, in the reference diode 137, and providing a reference voltage, Vbias, at node 138. When the capacitance of the Vbias node 138 is high and the nominal reference current 143 is low, the charging time of the Vbias node 138 may be too long (for example, tens of $\mu s$); this can be overcome (reducing the charging time to a few $\mu s$) by increasing the control current 142 for the current mirror during the initial charging of the Vbias node 138. The increase in control current 142 is provided by transistor 141; W/L of transistor 133 is much greater than W/L of transistor 134, which allows for a much higher control current 142 when transistor 141 is activated. Transistor 141 is controlled by applying an 'enable auxiliary branch' signal to its gate 139; this 'enable auxiliary branch' signal can be the output signal Vcc_RISING generated by the power-on management system 80. The transistors 133 and 141 constitute the auxiliary current branch, utilized during power-on to provide faster charging of the Vbias node 138. Further circuits (not shown) may be incorporated into the current generator of FIG. 6, such as disabling, error correction and other optional circuits.

FIG. 7 shows the internal regulated supply, Vcc_INT, node discharger. The Vcc_INT node 151 is discharged by a high voltage n-channel transistor 154, controlled by the DISCH_Vcc signal applied to its gate 153. A protection resistor 152, of typically a few ohms, is connected between the transistor drain 155 and the Vcc_INT node 151. The Vcc_INT node discharger functions to discharge the internal supply nodes of the voltage down-converter at the start of power-on, so as to ensure that the power-on always starts from the same initial condition.

FIG. 8 shows the form of all of the signals identified in the power-on management system 80 in FIG. 4. Voltage is plotted against time, with the signals spaced along the ordinate for clarity; note that all signals start at V=0 at T0. Vcc_EXT is the external supply voltage, which in this example is 3.3V, when high. In order to illustrate the operation of the power-on management system, Vcc_EXT is shown ramping up from its low at 0V to its high at 3.3V, ramping down to its low at 0V for a short duration and then ramping up to its high again. Vcc_INT is the internal regulated voltage, in this example the high is 1.8V.

Referring to FIG. 4, a first level detector 81 is connected to node 75 and senses the Vcc_INT signal voltage level. The level detector 61 generates an intermediate signal Vcc_LOW_NC (see FIG. 8) which is tied to Vcc_INT until a minimum voltage is reached at which the circuitry supplied by Vcc_INT will operate properly (in this example 1V); when Vcc_INT is at a voltage greater than this minimum, Vcc_LOW_NC is low.

As seen in FIG. 4, a second level detector 82 senses the voltage levels of signals Vcc_EXT, Vcc_LOW_NC and INT_RAMP_N. The level detector 82 generates an intermediate signal Vcc_EXT_LOW (see FIG. 8) which is tied to Vcc_EXT until a minimum voltage is reached at which the on-chip circuitry requiring the Vcc_EXT supply will operate properly (in this example 2V); when Vcc_EXT is at a voltage greater than this minimum, Vcc_EXT_LOW is low. An output signal of the level detector 82 is Vcc_RISING (see FIG. 8) which is tied to INT_RAMP_N except that when Vcc_RISING is high, it remains high until Vcc_LOW_NC goes low, then it too goes low; when Vcc_RISING is low it indicates that both Vcc_EXT and Vcc_INT have reached voltages at which their dependent on-chip circuitry will operate properly, even if the power-on is still on-going. When Vcc_RISING is low it disables the auxiliary current branch in the current generator (see FIG. 6). A further ouput signal from level detector 82 is Vcc_LOW (see FIG. 8) which is Vcc_LOW_NC shadowed by Vcc_RISING. Vcc_LOW remains low even when Vcc_INT has a glitch, as seen at T1 in FIG. 8; Vcc_LOW goes high only when Vcc_EXT goes low output signal Vcc_LOW is used as an input for the device in which the voltage down-converter is integrated and indicates that a power-on is ongoing when the signal is high.

Referring to FIG. 4, the 'delay falling edge' device 83 (hereafter referred to as a delay device) has intermediate signal Vcc_EXT_LOW as an input and generates an output signal DISCH_Vcc (see FIG. 8) which is tied to Vcc_EXT_LOW, except that it is delayed on the falling edge, by 1 $\mu$s in this example; when high, DISCH_Vcc enables the discharge of the Vcc_INT nodes, which grounds the gates of the drivers and pre-drivers and the amplifier in the voltage down-converter. As seen in FIG. 4, a second 'delay falling edge' device 85 (hereafter referred to as a delay device) is connected to the DISCH_Vcc node 84. The device 85 generates an intermediate signal INT_RAMP_N (see FIG. 8) which is tied to DISCH_Vcc, except with a further delay on the falling edge, by a fraction of a $\mu$s in this example; when INT_RAMP_N goes low it indicates that Vcc_INT is ramping up. Referring to FIG. 4, power-on generator 86 has a logic signal AWAKE (see FIG. 8) as an input; this input signal is generated by the device in which the voltage down-converter is inserted and when high it indicates that the internal power-on is complete. The power-on generator 86 has intermediate signal INT_RAMP_N as a further input and generates output signal POW_ON (see FIG. 8) which is tied to INT_RAMP_N, except that when POW_ON is high, it remains high until AWAKE goes high, then it goes low. The signal POW_ON is used as follows: when high it indicates that power-on is on-going; when high it forces the active mode of the voltage down-converter; and when low it turns off the local Vref generator (see FIG. 5). The present invention is applicable to a 3V to 1.8V voltage down-converter in a 0.18 $\mu$m technology flash memory device. It will be clear to those skilled in the art that the present invention is applicable to a wide range of memory devices and other integrated circuits requiring an on-chip voltage down-converter.

What is claimed is:

1. A power-on system for an on-chip voltage down-converter, the voltage down-converter requiring a reference voltage input, the power-on system comprising:

a local voltage reference generator;

a bandgap voltage reference generator; and a switch activated by a logic signal, BGAP_OK, said switch including inputs connected to said local voltage reference generator and said bandgap voltage reference generator and an output connected to the voltage down-converter, whereby only said local voltage reference generator is connected to the voltage down-converter until said bandgap voltage reference has reached its correct level, as indicated by said logic signal BGAP_OK, after which only said bandgap voltage reference generator is connected to the voltage down-converter.

2. A power-on system as in claim 1 further comprising a power-on management system for generating a signal, POW_ON, said signal POW_ON deactivating said local reference voltage generator when power-on is complete.

3. A power-on system for an on-chip voltage down-converter, the voltage down-converter providing a regulated internal supply, Vcc_INT, at an internal supply node, and requiring an external supply, Vcc_EXT, and a bias current control voltage, Vbias, the power-on system comprising:

a current generator including an auxiliary current branch, for producing the bias current control voltage, Vbias; and a power-on management system for generating a signal, Vcc_RISING, for disabling said auxiliary current branch when both external and internal supply voltages have reached a minimum level for proper operation of on-chip circuitry.

4. A power-on system as in claim 3 wherein said auxiliary current branch comprises a transistor gated by said signal Vcc_RISING.

5. A power-on system for an on-chip voltage down-converter, the voltage down-converter providing a regulated internal supply, Vcc_INT, at an internal supply node, the power-on system comprising:

a discharge circuit connected to the internal supply node; and a power-on management system, for generating a signal DISCH_Vcc to control the discharge of the internal supply node during power-on.

6. A power-on system as in claim 5 wherein said discharge circuit comprises a high voltage n-channel MOS transistor with its drain connected to the internal supply node and gated by said signal DISCH_Vcc.

7. A power-on system as in claim 6 further comprising a resistor connected between said transistor and said internal supply node.

8. A power-on system for an on-chip voltage down-converter, the voltage down-converter providing a regulated internal supply, Vcc_INT, at an internal supply node, the power-on system comprising:

a discharge circuit connected to the internal supply node, said discharge circuit having a high voltage n-channel MOS transistor with its drain coupled to the internal supply node with a resistor connected therebetween; and a power-on management system, for generating a signal DISCH_Vcc to control the discharge of the internal supply node during power-on, the transistor in the discharge circuit being gated by said signal DISCH_Vcc.

9. A power-on management system for an on-chip voltage down-converter, the voltage down-converter providing a regulated internal supply, Vcc_INT, at an internal supply node and requiring an external supply, Vcc_EXT, the power-on management system comprising:

a level detector connected to the external supply, for sensing the voltage level of Vcc_EXT, and generating an intermediate signal Vcc_EXT_LOW; and a first delay device connected to said level detector, for delaying the falling edge of said intermediate signal Vcc_EXT_LOW, thus generating an output signal DISCH_Vcc, said signal DISCH_Vcc controlling discharge of the internal supply node during power-on.

10. A power-on management system as in claim 9 further comprising:

a second delay device connected to said first delay device, for delaying the falling edge of said signal DISCH_Vcc, thus generating an intermediate signal INT_RAMP_N; and a power-on generator connected to said second delay device and including a logic signal input for receiving a logic signal, AWAKE, said power-on generator producing an output signal, POW_ON, said signal POW_ON indicating when the power-on is active.

11. A power-on management system as in claim 10 wherein said signal POW_ON is used to deactivate a local reference voltage generator when power-on is complete.

12. A power-on management system for an on-chip voltage down-converter, the voltage down-converter providing a regulated internal supply, Vcc_INT, at an internal supply node and requiring an external supply, Vcc_EXT, and a bias current control voltage, Vbias, the power-on management system comprising:

a first level detector connected to the internal supply node, for sensing the voltage level of input signal Vcc_INT and generating an intermediate signal, Vcc_LOW_NC;

a second level detector connected to the external supply, for sensing the voltage level of Vcc_EXT, and generating intermediate signal Vcc_EXT_LOW;

a first delay device connected to said second level detector, for delaying the falling edge of intermediate signal Vcc_EXT_LOW, thus generating an output signal DISCH_Vcc; and a second delay device connected to said first delay device, for delaying the falling edge of said signal DISCH_Vcc, thus generating an intermediate signal INT_RAMP_N;

wherein said second level detector is further connected to said first level detector and said second delay device, for sensing said intermediate signals INT_RAMP_N and Vcc_LOW_NC, said second level detector generating an additional output signal Vcc_RISING, said signal Vcc_RISING disabling an auxiliary current branch of a generator of the bias current control voltage, Vbias, when Vcc_INT and Vcc_EXT have reached minimum levels for proper operation of on-chip circuitry.

13. A power-on management system as in claim 12, wherein said second level detector generates a third output signal Vcc_LOW, said signal Vcc_LOW indicates when Vcc_INT has reached a minimum level for proper operation of circuitry supplied by Vcc_INT.

14. A power-on management system as in claim 13, wherein said output signal Vcc_LOW is not changed by glitches in the internal supply, Vcc_INT.

15. A power-on management system for an on-chip voltage down-converter, the voltage down-converter providing a regulated internal supply, Vcc_INT, at an internal supply node and requiring an external supply, Vcc_EXT, and a bias current control voltage, Vbias, the power-on management system comprising:

a first level detector connected to the internal supply node, for sensing the voltage level of input signal Vcc_TNT and generating an intermediate signal, Vcc_LOW_NC;

a second level detector connected to said first level detector and the external supply, and having an input signal INT_RAMP_N, said second level detector sensing the voltage level of Vcc_EXT, Vcc_LOW_NC and INT_RAMP_N, and generating intermediate signal Vcc_EXT_LOW and output signals Vcc_RISING and Vcc_LOW, said signal Vcc_RISING disabling an auxiliary current branch of a generator of the bias current control voltage, Vbias, when Vcc_INT and Vcc_EXT have reached minimum levels for proper operation of on-chip circuitry, and said signal Vcc_LOW indicating when Vcc_INT has reached a minimum level for proper operation of circuitry supplied by Vcc_INT, said signal Vcc_LOW being unchanged by any glitches in signal Vcc_INT;

a first delay device connected to said second level detector, for delaying the falling edge of intermediate signal Vcc_EXT_LOW, thus generating an output signal DISCH_Vcc, said signal DISCH_Vcc controlling discharge of the internal supply node during power-on;

a second delay device connected to said first delay device, for delaying the falling edge of said signal DISCH_Vcc, thus generating an intermediate signal INT_RAMP_N; and a power-on generator connected to said second delay device and including a logic signal input for receiving a logic signal, AWAKE, said power-on generator producing an output signal, POW_ON, said signal POW_ON indicating when the power-on is active, said signal POW_ON is used to deactivate a local reference voltage generator when power-on is complete;

wherein said input signal INT_RAMP_N of said second level detector is said intermediate signal INT_RAMP_N generated by said second delay device.

* * * * *